United States Patent
Razavieh et al.

(10) Patent No.: US 11,043,588 B2
(45) Date of Patent: Jun. 22, 2021

(54) VERTICAL FIELD EFFECT TRANSISTOR

(71) Applicant: GLOBALFOUNDRIES U.S. INC., Santa Clara, CA (US)

(72) Inventors: Ali Razavieh, Saratoga Springs, NY (US); Ruilong Xie, Niskayuna, NY (US)

(73) Assignee: GLOBALFOUNDRIES U.S. INC., Santa Clara, CA (US)

(*) Notice: Subject to any disclaimer, the term of this patent is extended or adjusted under 35 U.S.C. 154(b) by 0 days.

(21) Appl. No.: 16/413,168

(22) Filed: May 15, 2019

(65) Prior Publication Data

US 2020/0365728 A1    Nov. 19, 2020

(51) Int. Cl.
*H01L 29/78* (2006.01)
*H01L 29/16* (2006.01)
*H01L 27/088* (2006.01)
*H01L 29/66* (2006.01)

(52) U.S. Cl.
CPC ........ *H01L 29/7827* (2013.01); *H01L 27/088* (2013.01); *H01L 29/16* (2013.01); *H01L 29/66545* (2013.01); *H01L 29/66666* (2013.01)

(58) Field of Classification Search
None
See application file for complete search history.

(56) References Cited

U.S. PATENT DOCUMENTS

| | | |
|---|---|---|
| 9,685,537 B1 | 6/2017 | Xie et al. |
| 9,780,197 B1 | 10/2017 | Xie et al. |
| 10,103,247 B1 | 10/2018 | Xie et al. |
| 2018/0069131 A1* | 3/2018 | Balakrishnan .... H01L 29/78696 |
| 2018/0096996 A1* | 4/2018 | Bi .................... H01L 29/0692 |
| 2018/0122710 A1* | 5/2018 | Cheng ................ H01L 29/6653 |

OTHER PUBLICATIONS

Specification and Drawings for U.S. Appl. No. 16/027,834, titled "Method for Forming Replacement Gate Structures for Vertical Transistors" filed Jul. 5, 2018, 33 pages.

* cited by examiner

*Primary Examiner* — Alexander G Ghyka
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a vertical field effect transistor with optimized fin size and improved fin stability and methods of manufacture. The structure includes: a fin structure composed of substrate material, the fin structure includes: a trimmed channel region of the substrate material; a top source/drain region above the trimmed channel region and having a larger cross-section than the trimmed channel region; and a bottom source/drain region below the trimmed channel region and having a larger cross-section than the trimmed channel region; and gate material surrounding the trimmed channel region.

20 Claims, 6 Drawing Sheets

VERTICAL FIELD EFFECT TRANSISTOR

FIELD OF THE INVENTION

The present disclosure relates to semiconductor structures and, more particularly, to a vertical field effect transistor with optimized fin size and improved fin stability and methods of manufacture.

BACKGROUND

Field effect transistors (FETs) are formed on semiconductor substrates. The FET includes a channel region disposed between source and drain regions, and a gate configured to electrically connect the source and drain regions through the channel region. Horizontal FETs are structures where the channel region is parallel to the main surface of the substrate; whereas, vertical FETS (VFETs) are structures where the channel region is perpendicular to the main surface of the substrate. Accordingly, in a VFET device, the direction of the current flow between the source and drain regions is normal to the main surface of the substrate.

A VFET includes a vertical fin that extends upward from the substrate. The fin forms the channel region of the transistor. A source region and a drain region are situated in electrical contact with the top and bottom ends of the channel region, while the gate is disposed on one or more of the fin sidewalls. In other words, when viewing a VFET device from above, the channel region of the device is positioned vertically below one of the source/drain regions while the other source/drain region is positioned vertically below the channel region, i.e., the channel region is positioned vertically between a lower source/drain region and an upper source/drain region. In the architecture for a VFET, the contacted gate pitch may be decoupled from the gate length.

In order to achieve desirable, i.e., improved, electrical characteristics, the critical dimension of the channel of a VFET should be made as small as possible. However, such small critical dimensions lead to fin collapse due to the process schemes used to manufacture VFETs. For example, VFET patterning needs to have a very deep fin etching process to achieve a straight fin profile along the channel, as well as requiring a tall fin hardmask to accommodate all the process losses which are not mechanically stable. These schemes and additional structures can lead to a collapse of the fin.

SUMMARY

In an aspect of the disclosure, a structure comprises: a fin structure composed of substrate material, the fin structure includes: a trimmed channel region of the substrate material; a top source/drain region above the trimmed channel region and having a larger cross-section than the trimmed channel region; and a bottom source/drain region below the trimmed channel region and having a larger cross-section than the trimmed channel region; and gate material surrounding the trimmed channel region.

In an aspect of the disclosure, a structure comprises: a vertical fin structure composed of a channel region, a top source/drain region above the channel region; a bottom source/drain region below the channel region; interlevel dielectric material on opposing sides of the vertical fin structure; gate dielectric material surrounding the channel region and located on a single sidewall of the interlevel dielectric material at one side of the vertical fin structure; and gate metal on the gate dielectric material and also surrounding the channel region.

In an aspect of the disclosure, a method comprises: forming a fin structure composed of substrate material; forming a bottom source/drain region; forming a spacer on the substrate material covering the bottom source/drain region; forming sacrificial gate liner on the fin structure; forming interlevel dielectric material on the fin structure over the sacrificial gate liner; forming a top source/drain region; removing the interlevel dielectric material from one side of the fin structure and keeping the interlevel dielectric material on another side of the fin structure; removing the sacrificial gate liner; trimming the fin structure at a channel region; forming gate material at the trimmed channel region; and replacing the interlevel dielectric material on the one side of the fin structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a vertical field effect transistor (VFET) with optimized fin size and improved fin stability and methods of manufacture. More specifically, the present disclosure provides a an integration method to enable robust formation of aggressively thin fins for VFETs. For example, in implementing the processes described herein, the fin critical dimension is not limited by fin etching processes (e.g., reactive ion etching or RIE); instead, the fin thickness can be aggressively scaled through an additional fin trimming process without compromising the fin stability. Advantageously, by implementing the fabrication processes herein, it is now possible to provide a VFET with improved overall performance.

In embodiments, the VFET is implemented with a replacement gate structure. In further embodiments, the VFET has a semiconductor (e.g., Si) channel thickness smaller than a space (or segment) between a top spacer and a bottom spacer. The channel region generally has a longitudinal direction perpendicular to the surface of the substrate. A high-k gate dielectric is present at one sidewall of the interlevel dielectric material for each VFET, and not both sides. Moreover, in embodiments, the interlevel dielectric material is used as an anchor in order to increase stability of the vertical fin and any hardmask material used with the vertical fin of the VFET. Also, by implementing the processes herein, the critical dimension of the channel thickness of the VFET can be approximately 6 nm or less. The fin CD is also not limited to the conventional fin RIE process and can aggressively be scaled through the trimming process described herein.

The vertical FET of the present disclosure can be manufactured in a number of ways using a number of different tools. In general, though, the methodologies and tools are used to form structures with dimensions in the micrometer and nanometer scale. The methodologies, i.e., technologies, employed to manufacture the vertical FET of the present disclosure have been adopted from integrated circuit (IC) technology. For example, the structures are built on wafers and are realized in films of material patterned by photolithographic processes on the top of a wafer. In particular, the fabrication of the vertical FET uses three basic building blocks: (i) deposition of thin films of material on a substrate, (ii) applying a patterned mask on top of the films by photolithographic imaging, and (iii) etching the films selectively to the mask.

Figure 1:
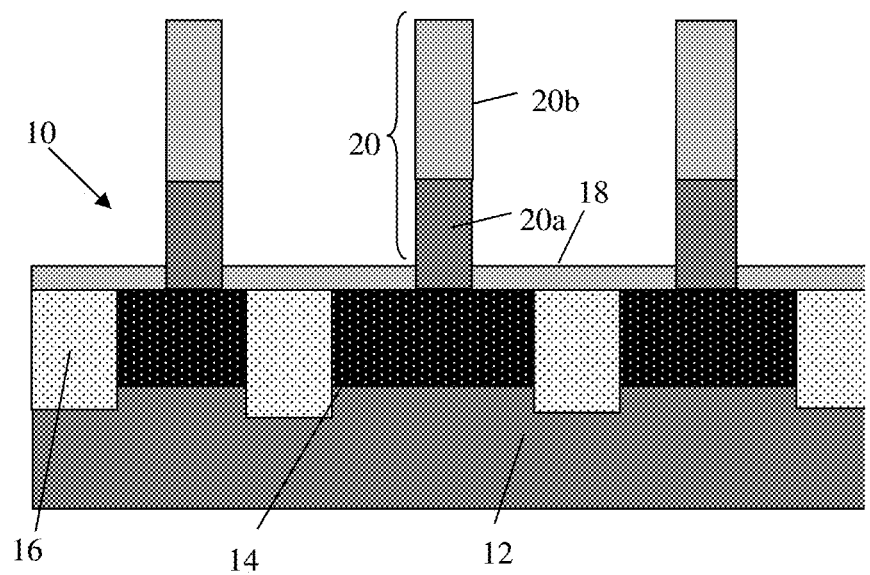
FIG. 1 shows fin structures, amongst other features, and respective fabrication processes in accordance with aspects of the present disclosure.

FIG. 1 shows fin structures, amongst other features, and respective fabrication processes in accordance with aspects of the present disclosure. More specifically, the structure 10 includes a substrate 12 composed of semiconductor material. In embodiments, the substrate 12 may be composed of any suitable material including, but not limited to, Si, SiGe, SiGeC, SiC, GaAs, InAs, InP, and other III/V or II/VI compound semiconductors. Bottom source/drain regions 14 are formed in the substrate 12 using any conventional ion implanting process or doping process known to those of skill in the art such that no further explanation is required. For example, the doped semiconductor material can be Si doped with phosphorous for a NFET device and Si doped with boron for a PFET device. In embodiments, the source/drain regions 14 can be formed prior to or after formation of fin structures 20.

Still referring to FIG. 1, shallow trench isolation regions 16 separate or isolate the source/drain regions 14, e.g., after fin formation. The shallow trench isolation regions 16 can be formed by conventional lithography, etching and deposition methods known to those of skill in the art. For example, a resist formed over the substrate 12 is exposed to energy (light) to form a pattern (opening). An etching process with a selective chemistry, e.g., RIE, will be used to form one or more trenches in the substrate 12 (and extend through the source/drain regions 14) through the openings of the resist. The resist can then be removed by a conventional oxygen ashing process or other known stripants. Following the resist removal, insulator material (e.g., oxide) can be deposited by any conventional deposition process, e.g., chemical vapor deposition (CVD). Any residual material on the surface of the substrate 12 can be removed by conventional chemical mechanical polishing (CMP) processes.

As further shown in FIG. 1, fin structures 20 are formed over the source/drain regions 14. In embodiments, the fin structures 20 are formed from substrate material 20a (e.g., substrate 12) and hardmask material 20b deposited on the substrate, which thereafter is patterned to form the fin structures 20. In embodiments, the substrate material 20a will be used as the channel for the VFET. The hardmask material 20b can be, for example, Ni or $NiO_2$. A bottom spacer 18 is formed over the source/drain regions 14, at the bottom of the fin structure 20. The bottom spacer 18 can be, e.g., SiN, formed by a conventional deposition method, e.g., CVD.

In embodiments, the fin structures 20 can be formed by conventional etching processes including sidewall imaging techniques (SIT). In an example of a SIT technique, a mandrel material, e.g., $SiO_2$, is deposited on the hardmask material 20b using conventional CVD processes. A resist is formed on the mandrel material and exposed to light to form a pattern (openings). A RIE is performed through the openings to form the mandrels. Spacers are formed on the sidewalls of the mandrels which are preferably material that is different than the mandrels, and which are formed using conventional deposition processes known to those of skill in the art. The spacers can have a width which matches the dimension of the fin structures 20. For example, the critical dimension (e.g., width or cross-section) of the fin structures 20 can be about 8 nm to 10 nm, which ensures fin stability. The height of the fin structures 20 can be about 40 nm, with the substrate material 20a being about 20 nm to 30 nm in height; although other dimensions are also contemplated herein. The mandrels are removed or stripped using a conventional etching process, selective to the mandrel material. An etching is then performed within the spacing of the spacers to form the sub-lithographic features. The sidewall spacers can then be stripped.

Figure 2:
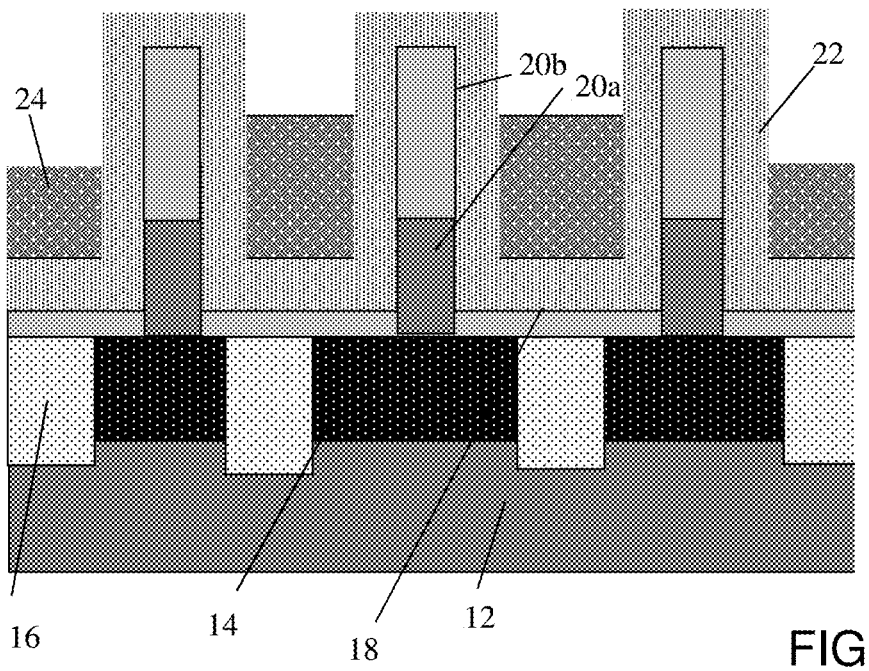
FIG. 2 shows dummy gate material deposited over the fin structures, amongst other features, and respective fabrication processes in accordance with aspects of the present disclosure.

FIG. 2 shows a dummy gate material (sacrificial gate liner) 22 deposited over the fin structures 20 and bottom spacer 18. In embodiments, the dummy gate material 22 can be SiGe, $SiO_2$, poly Si or other material selective to at least the material 20a. The dummy gate material 22 can be deposited by a conventional deposition process, e.g., CVD. An organic planarization layer (OPL) 24 is deposited on the dummy gate material 22, followed by a recessing process. In embodiments, the OPL 24 can be deposited by a spin on process as is known by those of ordinary skill in the art. Also, as shown in FIG. 2, the recessing process, e.g., etch back process, may result in a non-uniform height of the OPL 24. In embodiments, the OPL 24 will remain above the substrate material 20a of the fin structures 20.

Figure 3:
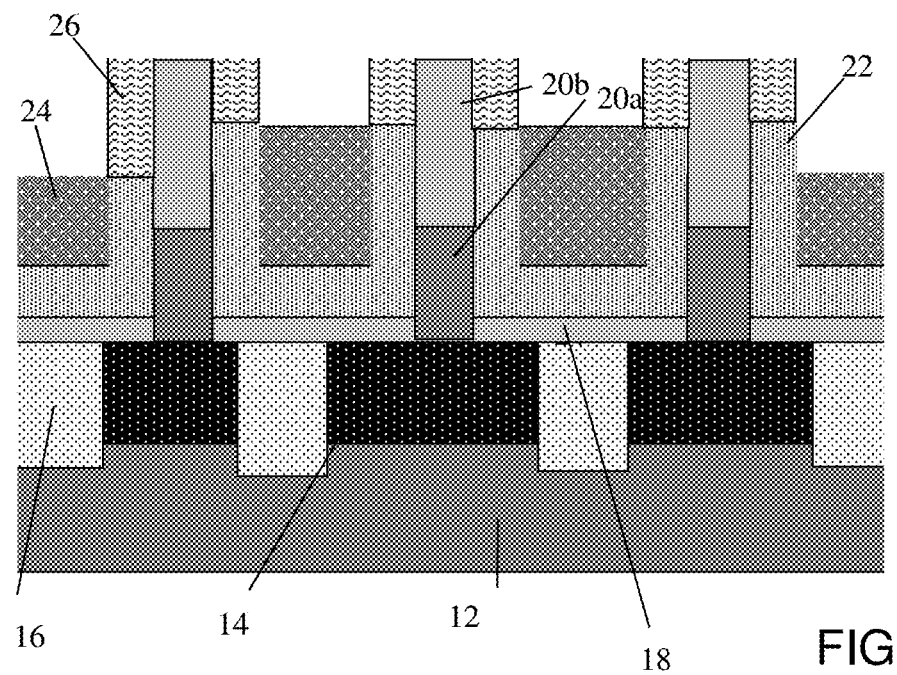
FIG. 3 shows recessed dummy gate material, amongst other features, and respective fabrication processes in accordance with aspects of the present disclosure.

FIG. 3 shows the dummy gate material 22 recessed to a height of the OPL 24. The recessing can be performed by an etch back or chamfering process, as non-limiting examples. In embodiments, the dummy gate material 22 will remain above the substrate material 20a of the fin structures 20. A sidewall spacer (e.g., another sacrificial gate liner) 26 is formed on the sidewalls of the fin structures 20 (e.g., exposed material 20b), above the dummy gate material 22.

In embodiments, the sidewall spacer 26 can be composed of a nitride material, as an example. The sidewall spacer 26 is formed by a blanket deposition of spacer material, followed by an anisotropic etching process. As should be understood by those of ordinary skill in the art, the anisotropic etching process will remove the spacer material from horizontal surfaces of the structure, leaving the sidewalls spacers 26 on the material 20b.

Figure 4:
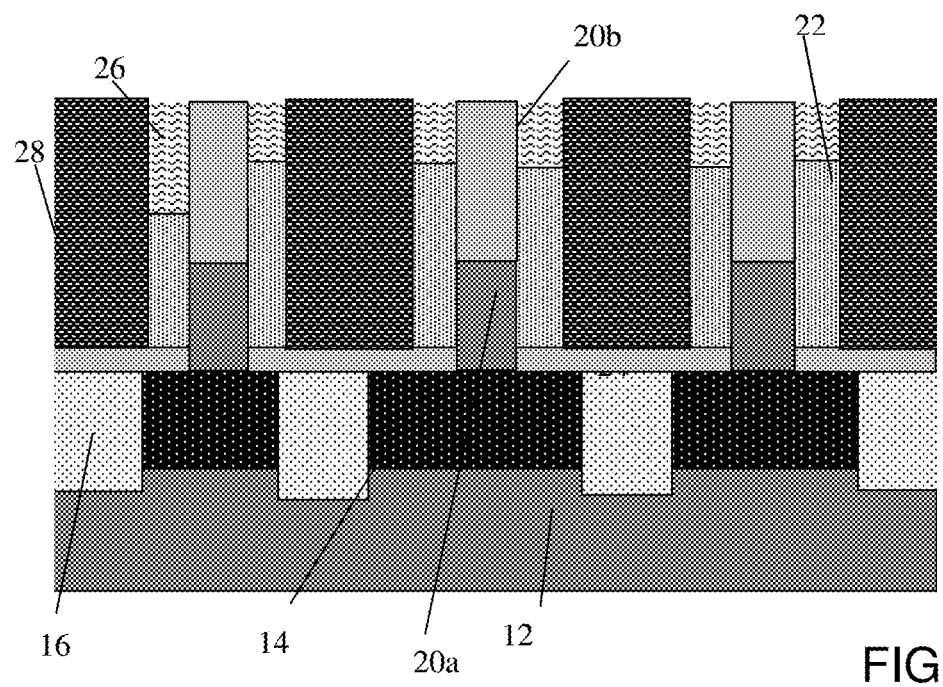
FIG. 4 shows interlevel dielectric material deposited between the fin structures, amongst other features, and respective fabrication processes in accordance with aspects of the present disclosure.

FIG. 4 shows interlevel dielectric material 28 deposited between (e.g., adjacent) the fin structures 20, e.g., materials 20a, 20b. More specifically, in FIG. 4, the OPL material is removed using an ashing process, for example, while the sidewall spacer 26, dummy gate material 24 and the material 20b will protect the underlying substrate material 20a of the fin structures 20 from being eroded away during the removal process. Following the removal of the OPL material, the interlevel dielectric material 28 will be deposited by a conventional deposition process, e.g., CVD, following by a planarization process. In embodiments, the planarization process can be a CMP process.

Figure 5:
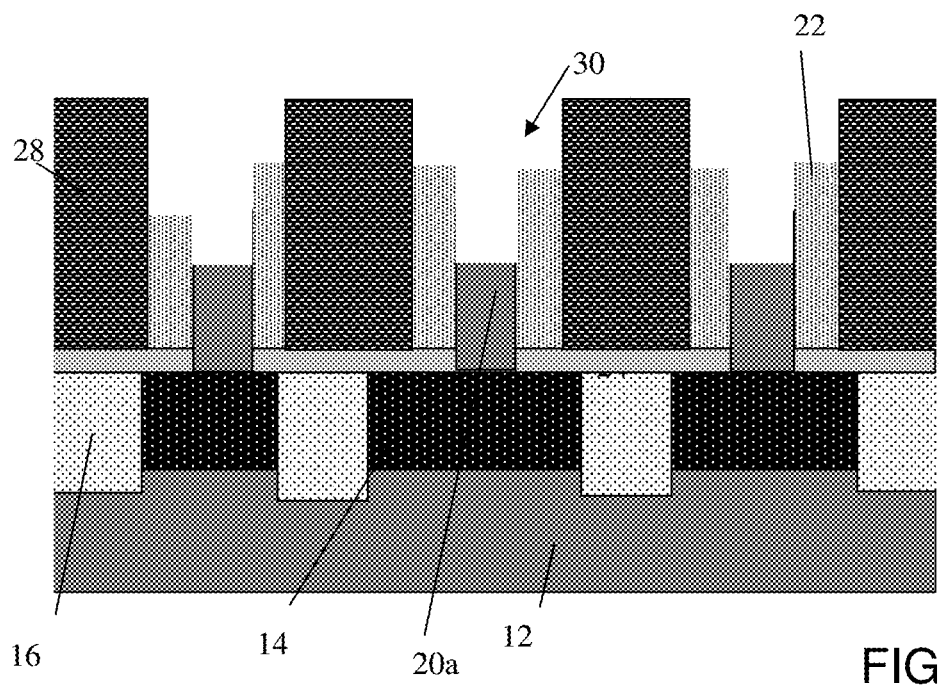
FIG. 5 shows a trench or recess formed between the interlevel dielectric material, amongst other features, and respective fabrication processes in accordance with aspects of the present disclosure.

FIG. 5 shows a trench or recess 30 formed by the removal of the sidewall spacers 26 and material 20b. In embodiments, the sidewall spacers 26 and material 20b can be removed by selective etching processes. For example, the selective etching process is selective to the dummy gate material 22, hence leaving the dummy gate material 22 intact. Also, the removal of the material 20b will expose the material 20a through the trench or recess 30.

Figure 6:
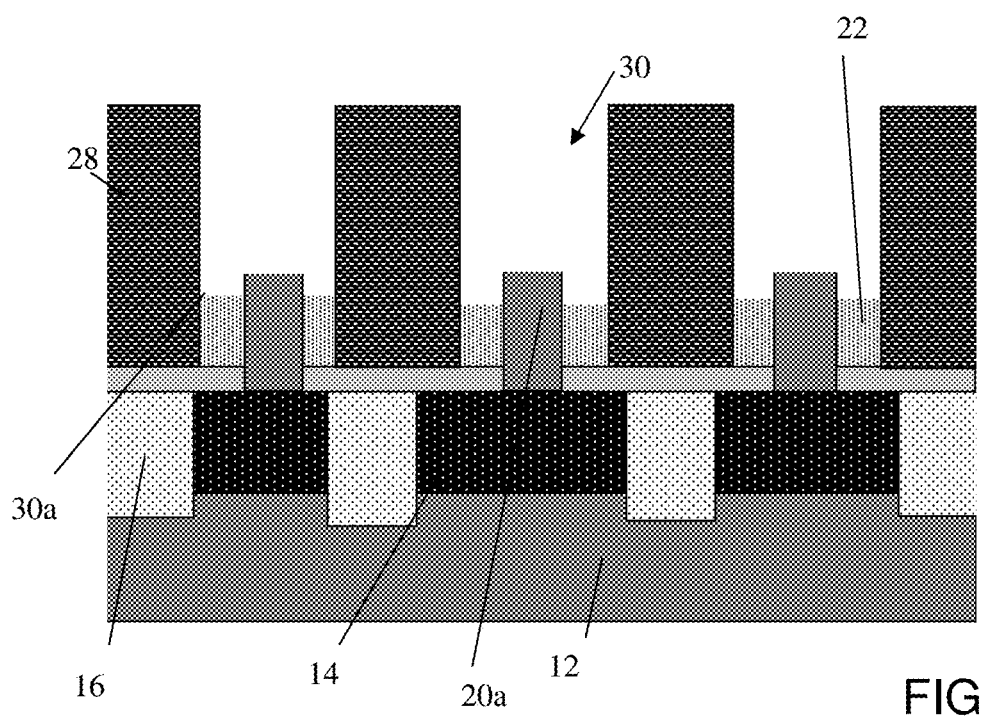
FIG. 6 shows a dummy gate recess and a uniform gate length (Lgate), amongst other features, and respective fabrication processes in accordance with aspects of the present disclosure.

FIG. 6 shows a dummy gate recess process to achieve a uniform gate length (Lgate) of the substrate material 20a. For example, in embodiments, the dummy gate material 22 is etched back to expose portions of the sidewalls of the substrate material 20a. This process uses isotropic etching processes to remove the dummy gate material 22 from the sidewall of the material 20a, with some over etch to generate a recess divot 30a (below the material 20a). This process will also remove a portion of the material 20a, achieving a uniform gate length (Lgate). Advantageously, regardless of the incoming height of the dummy gate, the recess divot 30a will have the same depth, e.g., about 5 nm to 10 nm, and more preferably about 6 nm. Said otherwise, the material 20a will be exposed and will extend above the dummy gate material 22 by about 5 nm to 10 nm, and more preferably about 6 nm.

Figure 7:
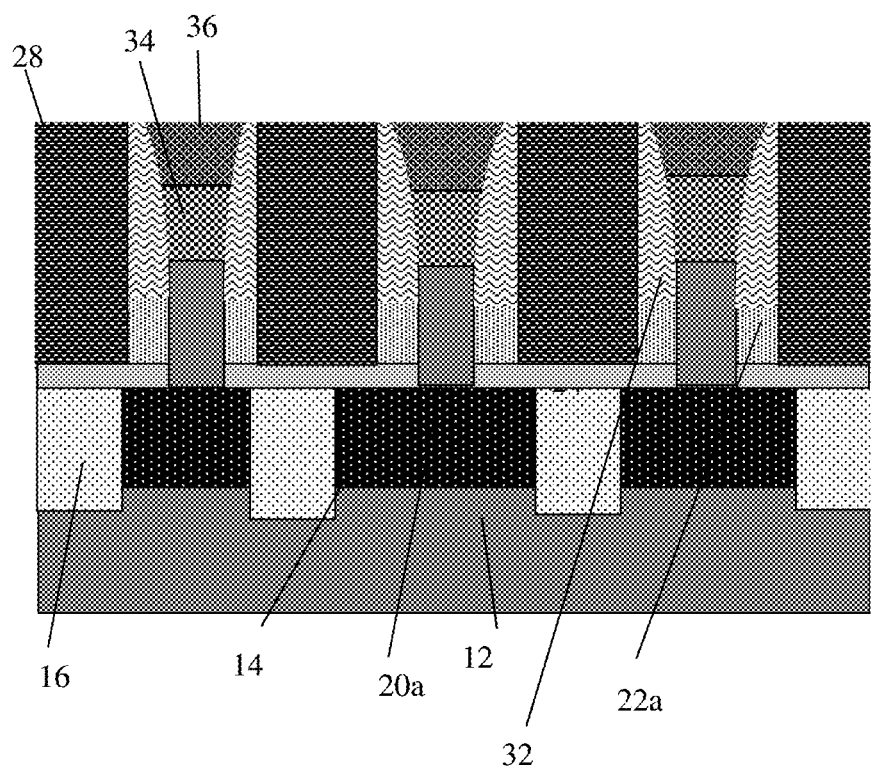
FIG. 7 show sidewall spacers on exposed interlevel dielectric material, amongst other features, and respective fabrication processes in accordance with aspects of the present disclosure.

As shown in FIG. 7, sidewall spacers (e.g., top spacers) 32 are formed on the exposed interlevel dielectric material 28, above the dummy gate material 22. In embodiments, the sidewalls spacers 32 will contact the exposed sidewalls of the material 20a, and can be composed of a nitride material or other low-k dielectric material, e.g., SiOCN. To form the sidewall spacers 32, the material of the sidewalls spacers 32 is blanket deposited on the structure including within the recess 30 and recess divot 30a, followed by an anisotropic etching process.

Still referring to FIG. 7, an epitaxial material 34 is grown on the substrate material 20a. In embodiments, the epitaxial material 34 is a doped semiconductor material (e.g., Si) to form a top drain/source region. For example, the doped semiconductor material can be Si doped with phosphorous for a NFET device and Si doped with boron for a PFET device. A top cap 36 is formed on the epitaxial material 34, e.g., doped semiconductor material. The top cap 36 can be a nitride material deposited by a conventional deposition process, e.g., CVD, followed by a CMP process.

Figure 8:
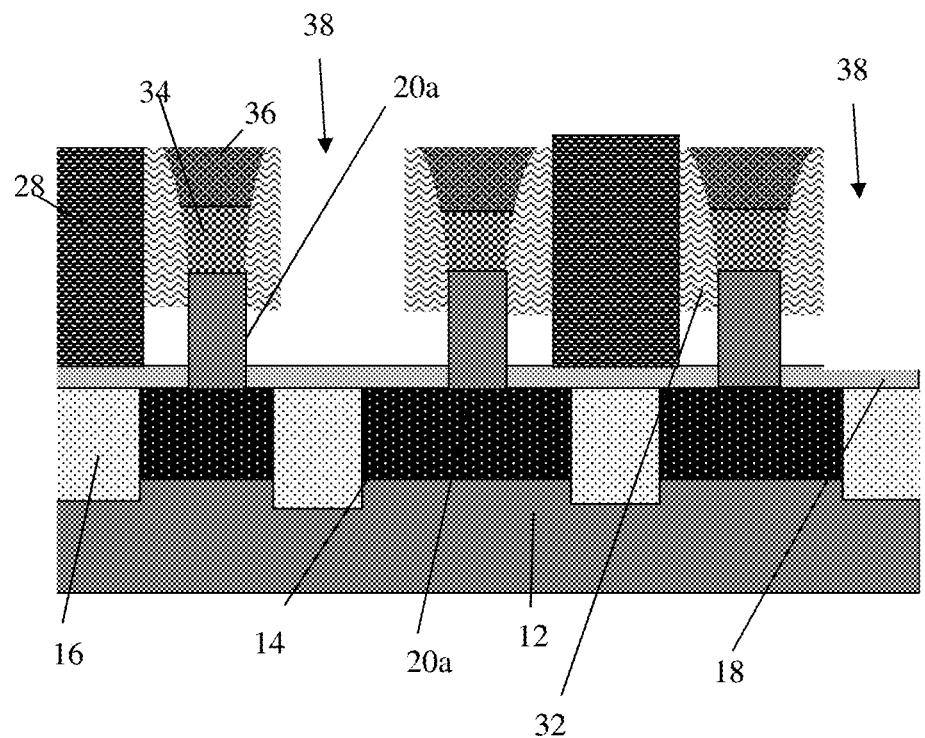
FIG. 8 shows an exposed channel region, amongst other features, and respective fabrication processes in accordance with aspects of the present disclosure.

As shown in FIG. 8, the dummy gate material 22 and selected interlevel dielectric material 28 are removed from the fin structure, e.g., substrate material 20a. As shown in FIG. 8, the removal of the dummy gate material 22 will expose a channel region of the VFET composed of the substrate material 20a, with the top of the substrate material 20a protected by the sidewall spacers 32 and the bottom of the substrate material 20a protected by the bottom spacer 18. Also, as shown in FIG. 8, the interlevel dielectric material 28 will be removed only from a single side of the fin structure, e.g., substrate material 20a, in order to gain access to the dummy gate material 22, for removal. In this way, the interlevel dielectric material 28 will remain on one side of the fin structure, providing support (e.g., an anchor) and stability during subsequent channel trimming processes.

In embodiments, the removal of the selected interlevel dielectric material 28 is achieved by conventional lithography and etching processes, with a mask material used to protect non-removed interlevel dielectric material 28. The dummy gate material, on the other hand, can be removed by a selective maskless etching process as should be understood by those of skill in the art.

Figure 9A:
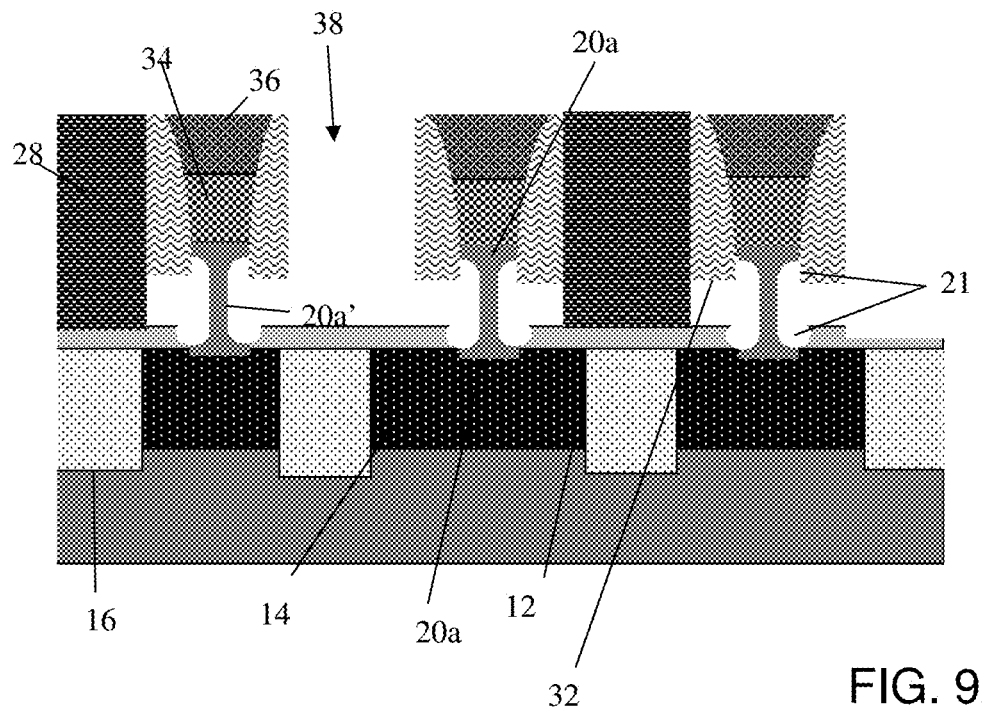
FIG. 9A shows a trimmed channel region, amongst other features, and respective fabrication processes in accordance with aspects of the present disclosure.

FIG. 9A shows a trimming process performed on the exposed portion of the substrate material 20a, e.g., channel region 20a' (of a VFET). In embodiments, the trimming process can be an atomic layer etch (ALE) process which precisely thins down the cross-section (e.g., width) of the channel region 20a', e.g., substrate material 20a. The trimming process can reduce the critical dimension of the substrate material 20a at the channel region 20a' to about 5 nm to 6 nm, with minimal or no process variations. In this way, the cross-sectional area of the channel region 20a' will be thinner (smaller) than the bottom and top source/drain regions 14, 34. The trimming process can also result in divots 21 formed between the substrate material 20a and the spacers 18, 32, e.g., bottom spacer 18 and top spacer 32. The divots 21 will be very uniform across the wafer. The interlevel dielectric material 28 on the single side of the fin structure (now composed of the substrate material 20a, doped source/drain region 34 and cap 36) will prevent gate collapse during and after the trimming process of the channel region 20a', hence assuring stability of the fin structure.

Figure 9B:
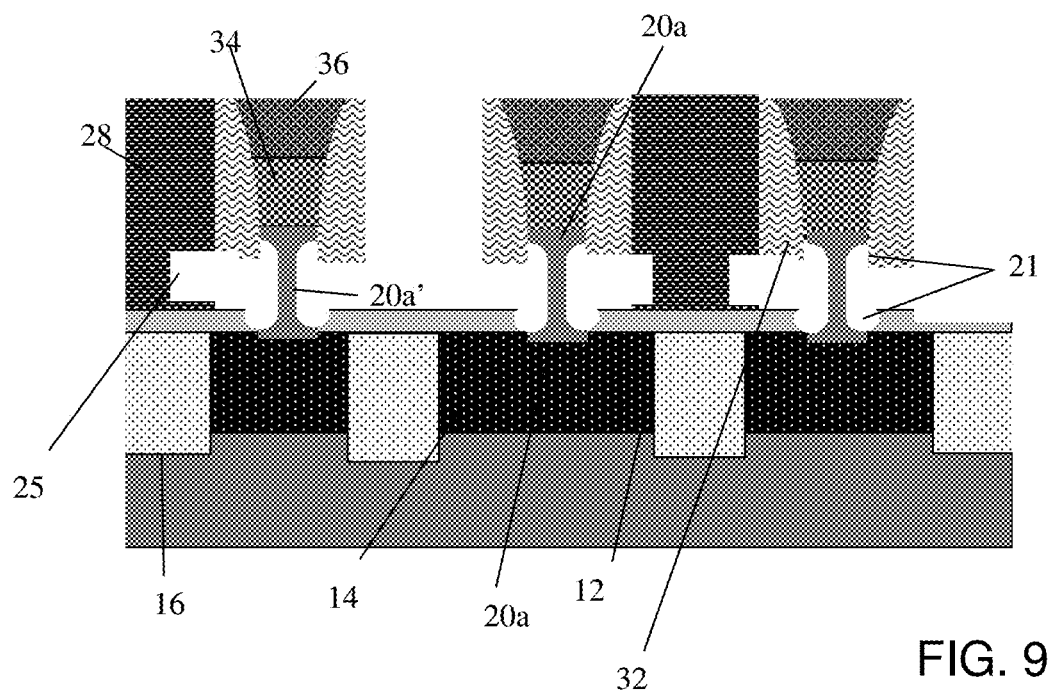
FIG. 9B shows a trimmed channel region and recess of interlevel dielectric material, amongst other features, and respective fabrication processes in accordance with aspects of the present disclosure.

As shown in FIG. 9B, an optional trimming or etch back of the interlevel dielectric material 28 can be provided at reference numeral 25. The optional trimming of the interlevel dielectric material 28 will provide additional space for the gate material, e.g., high-k gate dielectric material and metal gate material, if needed.

Figure 10:
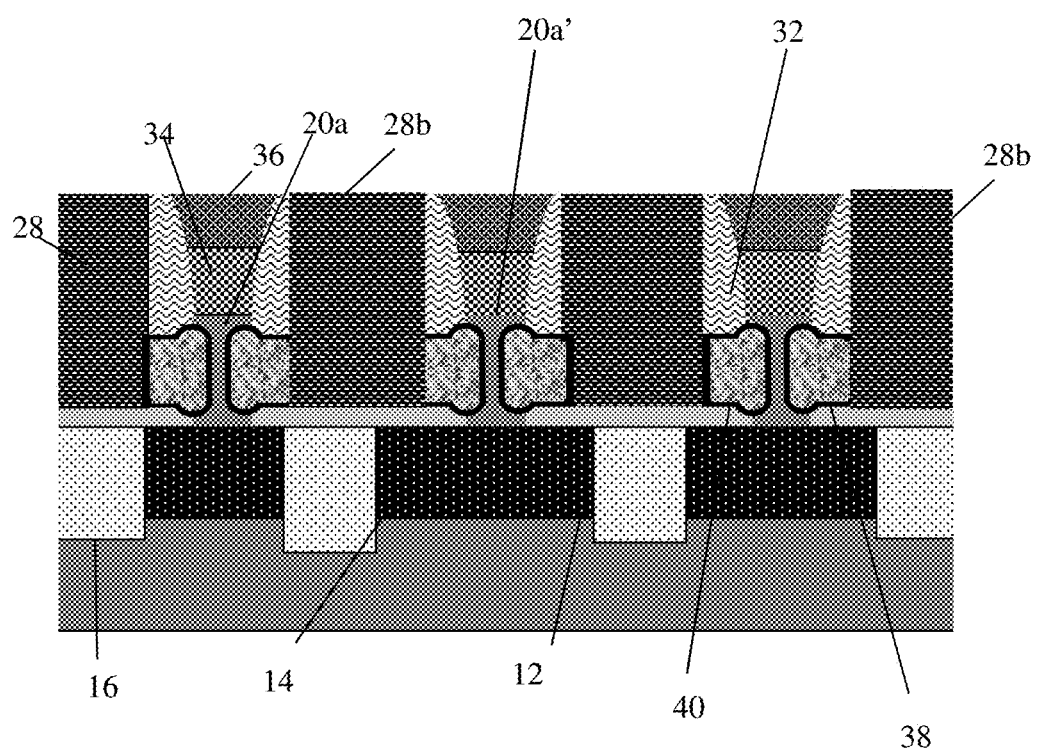
FIG. 10 shows a metal gate formed about the trimmed channel region, amongst other features, and respective fabrication processes in accordance with aspects of the present disclosure.

FIG. 10 shows the gate material formed within the divots 21 and the trimmed channel region 20a'. In embodiments, the gate material includes a gate dielectric material 38 and a workfunction metal 40. As shown in FIG. 10, the gate dielectric material 38 will be formed on a single side (or sidewall) of the two adjacent sides (or sidewalls) of the interlevel dielectric material 28 facing the fin structure. The single side (sidewall) upon which the gate dielectric material 38 will be formed corresponds to the portion of the interlevel dielectric material 28 which remained on the fin structure for stability during the trimming process. Following the deposition of the gate dielectric material 38 and workfunction metal 40, additional interlevel dielectric material 28b will be deposited (replaced) within the openings formed by the previous removal of the interlevel dielectric material to form the trimmed channel region 20a'.

Starting from the embodiment of FIG. 9B, the gate dielectric material 38 will be formed within the recess 25, again on a single side of the interlevel dielectric material 28. The gate dielectric material 38 will also be formed about the channel region 20a' (of the trimmed substrate material 20a) and in the divot 21. On the other hand, the remaining portion of the interlevel dielectric material 28b was deposited after the deposition of the gate dielectric material 38.

The gate dielectric material 38 can be a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The workfunction materials 40 for a p-channel VFET include Ti, TiAlC, Al, TiAl, TaN, TaAlC, TiN, TiC and Co. In embodiments, TiN is used for a p-channel VFET. Examples of the workfunction materials 40 for an n-channel VFET include TiN, TaN, TaAlC, TiC, TiAl, TaC, Co, Al, TiAl, HfTi, TiSi, TaSi or TiAlC. In embodiments, TaAlC, TiAl or Al is used for an n-channel VFET. The workfunction materials 40 may be formed by chemical vapor deposition (CVD), physical vapor deposition (PVD) including sputtering, atomic layer deposition (ALD) or other suitable method.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a fin structure composed of substrate material, the fin structure comprising:
      a trimmed channel region of the substrate material; and
      a top source/drain region above the trimmed channel region and having a larger cross-section than the trimmed channel region; and
   a bottom source/drain region below the trimmed channel region and comprising a larger cross-section than the trimmed channel region;
   a bottom spacer adjacent to the fin structure and contacting the bottom source/drain region;
   a divot within the bottom spacer in the trimmed channel region; and
   gate material surrounding the trimmed channel region and filling the divot.

2. The structure of claim 1, wherein the substrate material is semiconductor material.

3. The structure of claim 2, wherein the semiconductor material is Si.

4. The structure of claim 1, wherein the trimmed channel region is approximately 6 nm or less in width.

5. The structure of claim 1, wherein the trimmed channel region has a smaller cross-section than a top portion of the fin structure above the trimmed channel region and a bottom portion of the fin structure below the trimmed channel region.

6. The structure of claim 5, wherein the gate material is a high-k gate dielectric material and metal material over the high-k gate dielectric material, surrounding the trimmed channel region.

7. The structure of claim 5, further comprising a top spacer material which is interposed between and contacts with interlevel dielectric material and the fin structure, and the interlevel dielectric material further contacts a top surface of the bottom spacer material between adjacent fin structures.

8. The structure of claim 7, wherein the interlevel dielectric material includes a trimmed portion facing the trimmed channel region, and the gate material comprises gate dielectric material contacting the top spacer material, an upper surface of the bottom spacer material, and the trimmed portion of the interlevel dielectric material at a single side of the fin structure.

9. The structure of claim 8, wherein the high-k gate dielectric material is directly on the trimmed channel region.

10. The structure of claim 1, wherein the structure is a vertical field effect transistor (VFET).

11. The structure of claim 1, further comprising a top spacer on the fin structure, the top spacer having a divot which is filled with the gate material, the gate material comprising a gate dielectric material and a workfunction material, the gate dielectric material being in contact with the divot of the top spacer and the divot of the bottom spacer, and the gate dielectric material being in contact with the trimmed channel region, the top spacer and the bottom spacer.

12. A structure, comprising:
   a vertical fin structure composed of a channel region,
   a top source/drain region above the channel region;
   a bottom source/drain region below the channel region;
   interlevel dielectric material on opposing sides of the vertical fin structure;
   gate dielectric material surrounding the channel region and directly contacting a single sidewall of the interlevel dielectric material at one side of the vertical fin structure; and
   gate metal on the gate dielectric material and also surrounding the channel region.

13. The structure of claim 12, wherein the channel region is a trimmed channel region having a smaller cross-section than a top and bottom portion of the vertical fin structure, and further comprising:
   a top spacer contacting sidewalls of the top source/drain region;
   a bottom spacer contacting an upper surface of the bottom source/drain region;
   a trimmed portion of the interlevel dielectric material on a side of the channel region and facing the fin structure; and
   the gate dielectric material contacting the top spacer, the bottom spacer and surfaces of the trimmed portion of the interlevel dielectric material.

14. The structure of claim 13, wherein the trimmed channel region has a smaller cross section than the top source/drain region and the bottom source/drain region.

15. The structure of claim 13, wherein the trimmed channel region is approximately 6 nm or less in width.

16. The structure of claim 13, wherein the gate dielectric material is a high-k gate dielectric material which surrounds the trimmed channel region.

17. The structure of claim 16, further comprising top spacer material which is interposed between and in contact with the interlevel dielectric material and the fin structure and bottom spacer material which is interposed between the bottom source/drain region and the channel region, the bottom spacer material having a divot which is lined with the gate dielectric material, and the interlevel dielectric material is in contact with the bottom spacer between adjacent channel regions.

18. The structure of claim 17, further comprising a capping material on the top source/drain region and a spacer partly covering the bottom source/drain region, the spacer including a divot that is lined with the gate dielectric material.

19. The structure of claim 17, wherein the structure is a vertical field effect transistor (VFET).

20. A method comprising;
    forming a fin structure from substrate material;
    forming a bottom source/drain region;
    forming a bottom spacer on the substrate material covering the bottom source/drain region;
    forming interlevel dielectric material on the fin structure over the sacrificial gate liner;
    forming a top source/drain region;
    removing the interlevel dielectric material from one side of the fin structure and keeping the interlevel dielectric material on another side of the fin structure;
    trimming the fin structure at a channel region to form a trimmed channel region;
    forming gate material surrounding the trimmed channel region; and
    replacing the interlevel dielectric material on the one side of the fin structure, wherein
    the top source/drain region is above the trimmed channel region and comprises a larger cross-section than the trimmed channel region;
    the bottom source/drain region is below the trimmed channel region and comprises a larger cross-section than the trimmed channel region; and
    the bottom spacer is adjacent to the fin structure and contact the bottom source/drain region;
    and further forming a divot within the bottom spacer in the trimmed channel region; and
    the gate material fills the divot.

\* \* \* \* \*